(12) United States Patent
Chung

(10) Patent No.: US 6,580,035 B1
(45) Date of Patent: Jun. 17, 2003

(54) FLEXIBLE ADHESIVE MEMBRANE AND ELECTRONIC DEVICE EMPLOYING SAME

(75) Inventor: Kevin Kwong-Tai Chung, Princeton Township, NJ (US)

(73) Assignee: Amerasia International Technology, Inc., Princeton Junction, NJ (US)

( * ) Notice: Subject to any disclaimer, the term of this patent is extended or adjusted under 35 U.S.C. 154(b) by 0 days.

(21) Appl. No.: 09/226,543

(22) Filed: Jan. 7, 1999

Related U.S. Application Data

(60) Provisional application No. 60/092,048, filed on Jul. 8, 1998, provisional application No. 60/083,720, filed on Apr. 30, 1998, and provisional application No. 60/082,887, filed on Apr. 24, 1998.

(51) Int. Cl.$^7$ ................................................ H05K 1/03
(52) U.S. Cl. ........................ 174/255; 174/254; 174/259
(58) Field of Search ................................. 174/254, 255, 174/256, 259; 439/67

(56) References Cited

U.S. PATENT DOCUMENTS

| | | | |
|---|---|---|---|
| 2,014,524 A | 9/1935 | Franz | 175/359 |
| 2,774,747 A | 12/1956 | Wolfson et al. | 260/32.8 |
| 3,401,126 A | 9/1968 | Miller et al. | 252/514 |
| 3,429,040 A | 2/1969 | Miller | 29/626 |
| 3,818,279 A | * 6/1974 | Seeger, Jr. et al. | 317/101 CM |
| 4,113,981 A | 9/1978 | Fujita et al. | 174/88 R |
| 4,442,966 A | 4/1984 | Jourdain et al. | 228/123 |
| 5,046,415 A | 9/1991 | Oates | 101/128.3 |

(List continued on next page.)

OTHER PUBLICATIONS

P. Scharf, T. Coleman and K. Avellar, "Flip Component Technology", IEEE Electronic Component Conference (1967), pp. 269–274.

(List continued on next page.)

*Primary Examiner*—David L. Talbott
*Assistant Examiner*—Jeremy Norris
(74) *Attorney, Agent, or Firm*—Dann, Dorfman, Herrell & Skillman, P.C.

(57) ABSTRACT

An electronic device includes electronic components, such as "flip chip" semiconductor devices, chip resistors, capacitors and other electronic components, mounted to and interconnected to a substrate by a flexible adhesive membrane having contact pads that have substantially the same pattern as those of the corresponding electronic components. The flexible adhesive membrane includes an insulating matrix and conductive pads therein that employ thermoplastic and thermosetting adhesives, and combinations thereof, each having a low modulus of elasticity. The flexible conductive adhesive employed for the conductive pads or features preferably has a lower flow index than does the flexible adhesive employed for the insulating matrix, whereby the conductive features penetrate the insulating adhesive during bonding to assure reliable interconnection. Preferably, the higher flow index of the insulating adhesive facilitates it forming a fillet around the flip chip devices to provide a moisture barrier and additional mechanical strength to an assembled electronic device. Adhesives having flexibility and a low glass transition temperature are employed in the membrane to reduce internal stresses and enhance long-term bonding and contact reliability. The combination of adhesives may be selected to accommodate specific bonding and operating conditions. Such flexible membranes may also be employed for probing and testing semiconductor wafers and individual dies, as well as other small or delicate electronic components. Preferably, the contact pad features on the side of the flexible membrane that is to be probed have a sufficient area and pitch to facilitate probing, which area and pitch may be substantially greater than that on the side of the flexible membrane that is attached to the electronic component being tested.

25 Claims, 6 Drawing Sheets

U.S. PATENT DOCUMENTS

| | | | | |
|---|---|---|---|---|
| 5,074,947 | A | | 12/1991 | Estes et al. ............... 156/307.3 |
| 5,196,371 | A | | 3/1993 | Kulesza et al. ............. 438/119 |
| 5,237,130 | A | | 8/1993 | Kulesza et al. ............. 174/260 |
| 5,386,341 | A | | 1/1995 | Olson et al. ................. 361/749 |
| 5,539,153 | A | | 7/1996 | Schwiebert et al. ........ 174/260 |
| 5,575,662 | A | * | 11/1996 | Yamamoto et al. ........... 439/67 |
| 5,611,140 | A | | 3/1997 | Kulesza et al. ............... 29/832 |
| 5,667,884 | A | | 9/1997 | Bolger ........................ 428/323 |
| 5,719,354 | A | * | 2/1998 | Jester et al. ................. 174/255 |
| 5,855,063 | A | * | 1/1999 | Schreiber et al. ............. 29/848 |
| 5,879,761 | A | | 3/1999 | Kulesza |
| 5,977,490 | A | * | 11/1999 | Kawakita et al. ........... 174/265 |

OTHER PUBLICATIONS

Gilleo, K: "Direct Chip Interconnect Using Polymer Bonding", IEEE 39th Electronic Component Conference, May 1989, PP37–44.

R. Lachance, H. Lavoie, A Montanari, "Corrosion/Migration Study of Flip Chip Underfill and Ceramic Overcoating", IEEE Electronic Components and Technology Conference (1997), pp. 885–889.

T.Y. Wu, Y. Tsukada, W.T. Chen, "Materials and Mechanics Issues in Flip–Chip Organic Packaging", IEEE Electronic Components and Technology Conference (1996), pp. 524–534.

B. Rösner, J. Liu, Z. Lai, "Flip Chip Bonding Using Isotopically Conductive Adhesives", Electronic Components and Technology Conference, (1996) pp. 578–581.

D. Gamota, C. Melton, "Advanced Encapsulant Materials Systems for Flip Chip", Advancing Microelectronics (Jul./Aug. 1997) pp. 22–24.

R.W. Johnson, D. Price, D. Maslyk, M. Palmer, S. Wentworth, C. Ellis, "Adhesive Based Flip Chip Technology for Assembly on Polyimide Flex Substrates", IEEE International Conference on Multichip Modules, 1997, pp. 81–86.

L. Schaper, K. Maner, S. Ang, "Reliability of Large Conductive Polymer Flip Chip Assemblies for Multichip Modules (MCMs)", IEEE International Conference on Multichip Modules (1997), pp. 87–91.

Dr. V. Ozguz, R. DeLosReyes, Dr. K. Chung, Dr. J. Licari, "Flexible Conductive Adhesive Bumps for Chip Scale Packaging", The Technical Conference At Chip Scale International, May 1998, pp. 15–19.

K. Chung, V. Ozguz, "Flexible Conductive Adhesive as Solder Replacement in Flip Chip Interconnection", Proceedings Semicon West 1998, Jul. 1998, pp. 1–14.

"Cost Effective Solutions for Advanced Semiconductor Interconnection and Packaging", AI Technology, Inc., Jul. 1998.

Product Catalog No. 500, "Magnetool Electromagnets", Magnetool, Inc., pp. 1, 5–7, 12.

* cited by examiner

FIGURE 11
TABLE OF ADHESIVE CHARACTERISTICS

| Adhesive Material | Resin Type | Filler Material | Glass Transition Temperature | Melt-flow Temperature | Bonding Temperature |
|---|---|---|---|---|---|
| TP/LTP7150 | Thermoplastic | None | -55 °C | 200 °C | >200 °C |
| TP7157 | Thermoplastic | Silicon carbide particles | -55 °C | 200 °C | >200 °C |
| ESP/LESP7450 | Thermosetting | None | -55 °C | 80 °C | >125 °C |
| ESP7455 | Thermosetting | Alumina particles | -55 °C | 80 °C | >125 °C |
| ESP7555 | Thermosetting | Alumina particles | -55 °C | 80 °C | >80 °C |
| TP/LTP 8150 | Thermoplastic | Silver flakes | -55 °C | 200 °C | >200 °C |
| TP8159 | Thermoplastic | Gold-plated nickel flakes | -55 °C | 200 °C | >200 °C |
| ESP/LESP8450 | Thermosetting | Silver flakes | -55 °C | 80-100 °C | >125 °C |

FLEXIBLE ADHESIVE MEMBRANE AND ELECTRONIC DEVICE EMPLOYING SAME

This Application claims the benefit of U.S. Provisional Application Ser. No. 60/082,887 filed Apr. 24, 1998, of U.S. Provisional Application Ser. No. 60/083,720 filed Apr. 30, 1998, and of U.S. Provisional Application Ser. No. 60/092,048 filed Jul. 8, 1998.

The present invention relates to an electronic device and, in particular, to a flexible adhesive membrane and to an electronic device employing same.

There are many conventional ways of depositing solder or conductive adhesives for the bonding of electronic components and flip chip semiconductor devices to substrates, such as those set forth, for example in U.S. Pat. No. 3,401,126 entitled "Method of Rendering Noble Metal Conductive Composition Non-Wettable by Solder", U.S. Pat. No. 3,429,040 entitled "Method of Joining a Component to a Substrate", U.S. Pat. No. 4,113,981 entitled "Electrically Conductive Adhesive Connecting Arrays of Conductors", U.S. Pat. No. 5,074,947 entitled "Flip-Chip Technology Using Electrically Conductive Polymers and Dielectrics", U.S. Pat. No. 5,196,371 entitled "Flip Chip Bonding Method Using Electrically Conductive Polymer Bumps", U.S. Pat. No. 5,237,130 entitled "Flip Chip Technology Using Electrically Conductive Polymers and Dielectrics", and U.S. Pat. No. 5,611,140 entitled "Method of Forming Electrically Conductive Polymer Interconnects on electrical Substrates". One problem common to these prior art techniques is that they all require operations that are substantially different from those normally associated with semiconductor fabrication. As a result, a substantially different kind of operation and process is being employed and a new business has evolved in which service companies perform solder deposition onto semiconductor wafers as well as adhesive deposition onto such wafers.

With the advancing usage of multi-chip module (MCM) packaging, knowledge of whether each individual semiconductor die is operative under the anticipated functional and stress conditions should be obtained before assembly of such dies into the MCM, so as to increase the yield of operative MCMs and to lower the cost thereof. This so-called known-good-die (KGD) testing is especially important for the large-volume production, such as is the case in the personal computer industry where many complex microprocessors, cache and other memory chips, and other electronic components, are assembled onto a large computer motherboard.

Conventionally, the stressing of semiconductor die (for burn in and electrical testing) is normally performed on an individual semiconductor die mounted in an individual test socket or carrier. The cost and time involved are substantial (see, Carter et al. "Known Good Die Comes of Age", *Semiconductor International*, October 1997). Besides the semiconductor die manufacturers, there are many companies now performing services as die processors. The cost of such processing could be reduced if die testing and stressing could be performed at the semiconductor wafer level. However, a suitable interface is required between the wafer and the test probes and other test equipment executing the testing protocol and under the test temperature environmental conditions.

This separation of these deposition, testing and other processing operations from the semiconductor wafer fabrication operations creates a time delay, perhaps as long as one to four weeks, in overall processing. This delay is unacceptable, especially where a problem arises because the delay in communicating the problem to the semiconductor wafer manufacturer delays the making of any required process change or improvement and usually results in wafers that are processed in the interim being unusable, further reducing the yield of acceptable product and increasing its cost.

Thus, there is a need for a fast and easy method of forming membranes of conductive adhesive and insulating adhesive underfill for attachment to electronic components, such as semiconductor flip chips, whether for the purpose of flip chip probing and stress testing, or for subsequent bonding to a substrate, or both.

In the case of solder deposition, solderable metallization must be first deposited on the contacts or bond pads which are usually aluminum, such as by an electroless, electrolytic, or vacuum evaporation process, so that the solder paste may be stenciled onto the solderable contacts or bond pads and reflowed to form solder bumps that will adhere to the contacts or bond pads. In the case of conductive adhesive, the contacts or bond pads are normally passivated with precious metal to prevent oxidation before the conductive adhesive in paste form is deposited, such as by screening or stenciling, onto the contacts or bond pads. The lowest cost for these processes is estimated to be about US$50 for a 6-inch diameter semiconductor wafer, even for high-volume production. While precious metal passivation must always be first made before any use of the conductive adhesive, the flash process for depositing nickel-gold or nickel-palladium combinations of layers is well established and can readily be accommodated in a sequential fabrication operation within almost any semiconductor fabrication facility.

Semiconductor die and other flip-chip components normally have fine contact pad size and pitch (i.e. center-to-center separation between adjacent contact pads or other features), whereas the substrate or "next-level board" to which they are bonded often employ lower-cost substrate materials such as FR4, ceramic, and other organic laminates, which in general afford electrical interconnections and contact pads that are normally on a larger scale and pitch than those afforded in semiconductor processing. For example, present-day semiconductor processing can produce micron-size and submicron-size features while the state-of-the-art etching techniques for FR4/copper and thick-film deposition on ceramic or organic substrates can produce features of about 75 microns or larger size. Thus, there is a need for making reliable and low cost interconnections without sacrificing the fine-feature size and fine pitch capabilities of semiconductor processing to accommodate lesser capabilities of the substrate processing operation.

Another consideration in attaching semiconductor and other flip-chip components to a substrate is that of obtaining and maintaining intimate interfacial contact between the component and the substrate so that there will be adequate thermal energy transfer which leads to lower temperature operation and to greater reliability. Good thermal conductivity will not be obtained where air, voids or other foreign matter is trapped between the chip and the substrate, and is particularly difficult to obtain where a patterned membrane of conductive and insulating organic polymer adhesive is employed. If a non-flowing dielectric underfill material is used, such as an epoxy of the sort described in U.S. Pat. No. 5,074,947 entitled "Flip-Chip Technology Using Electrically Conductive Polymers and Dielectrics" issued to Estes et al. voids will almost always form along the interface and thus, poor thermal conductivity will result across the interface between the electronic component and the substrate. In addition, if a rigid conductive adhesive of the sort described in the Estes et al. patent is used, the conductive adhesive will be subject to delamination and fracture under thermal stress and the interconnections formed thereby will be unreliable; the non-adhering dielectric underfill will not relieve the strain on the conductive adhesive and truly improve the aforementioned poor reliability.

A membrane having a pattern of conductive pads within an insulating matrix employing a high strength adhesive system having a high modulus of elasticity is reported by R. W. Johnson, et. al. "Adhesive Based Flip Chip Technology for Assembly on Polyimide Flex Substrates", *International Conference on Multichip Modules*, (April, 1997). One problem with the approach reported by Johnson et. al. is that their rigid resin system having a high modulus of elasticity, such as a novolac epoxy base resin having a high glass transition temperature Tg of typically 150° C. and a modulus of elasticity of about 2,000,000 psi, can not accommodate the substantial differences between the coefficients of thermal expansion (CTE) of semiconductor dies or chips and of substrate materials, such as FR4, ceramic and other common rigid substrate materials commonly employed, over the range of thermal temperatures typically specified and/or experienced. The approach of Johnson et al. to employ a flexible substrate that is capable of yielding or flexing may not be compatible with many applications, especially certain computer, telecommunication aerospace and defense applications. An alternate approach of engineering a customized substrate material that closely matches of the electronic components that will be attached thereto is both too expensive for many applications and impractical where the electronic components themselves have substantially different CTEs. In most applications, however, one must eventually connect to an FR4 printed circuit wiring board that has a very high CTE of about 17 ppm/° C.

Thus, one major problem of component-to-substrate and component-to-circuit board interconnection is the internal stresses arising from the differing coefficients of thermal expansion between, for example, silicon chips and the next level substrate or board. Both conventional C4 rigid adhesive and solder-bump technologies are hampered by high stress-related failures when used over extreme temperature ranges and for semiconductor chips having larger dimensions. Although conventional rigid underfill helps to enhance the life of such interconnections under thermal cycling conditions, perhaps by a factor of 6–8 depending on size of the semiconductor die and the magnitude of the temperature excursions, the inherent problem of trading the beneficial compressive stress provided by the high-strength or rigid underfill that limits the thermal cycling strain with the oft devastating shear stress on the conductive interconnections that will delaminate or break the interconnection joints or the electronic components. Undesirably, every increase in the semiconductor die dimension or extension of the temperature range to a lower or higher temperature produces some increase in the shear stress, and thus reliability of the entire device must be reevaluated, such as by extensive and expensive testing.

Further, U.S. Pat. No. 5,667,884 entitled "Area Bonding Conductive Adhesive Preforms" issued to Bolger describes sheet preforms comprising a multiplicity of electrically conductive adhesive members, each being separated from the other by a non-electrically conductive adhesive, and being useful in the assembly of multi-chip modules and other electronic devices. The sheet preforms as described in the Bolger patent, however, remain on the release film on which they are formed until they are attached to a semiconductor component or a substrate, perhaps because they may lack dimensional stability if separated therefrom. In addition, Bolger's sheet preforms also have several other undesirable, and perhaps more important, limitations. First, Bolger requires that the conductive adhesive elements extend above the surface of the non-conductive adhesive, generally having a height in the range of 125%–225%, and preferably about 150%–200%, of the thickness of the surrounding non-conductive adhesive, while also being less than 150% of its diameter (column 7, lines 8–15). Bolger further prefers that the conductive adhesive elements be conical in shape or be dome shaped to help prevent subsequently provided non-conductive adhesive from completely covering even one conductive adhesive member (column 6, lines 32–42). In fact, it appears from Bolger's repetition of the point to be of great importance that care be taken to avoid covering the tops of previously formed conductive adhesive members with the non-conductive adhesive composition (column 12, lines 31–46).

Resins generally suitable according to Bolger include high Tg thermoplastic and thermosetting polymers that cure at greater than 120° C. and have a glass transition temperature Tg greater than about 70° C. (column 8, lines 33–46). Bolger further states that while reducing the glass transition temperature and the modulus of elasticity of the adhesive can reduce thermal stress, such may have major disadvantages, and so prefers a rigid (high Tg) adhesive to improve resistance to swelling, corrosion and other failure of adhesive bonds during exposure to heat and humidity (column 9, lines 38–56). High Tg materials are also preferred by Bolger to avoid excessive softening when the adhesive is exposed to high temperatures (Id.). The adhesive in Bolger's examples I–III, for example, are novolac epoxy resins that form relatively rigid adhesives having a Tg which is typically over 150° C. and a modulus of elasticity of over $10^6$ psi, i.e. over one million psi (column 7, lines 46–55).

Accordingly, there is a need for a flexible membrane that avoids the tendency to interconnect failure inherent with rigid adhesives and yet is convenient to apply to components and substrates, i.e. is easy to utilize, and is easily fabricated. Further, there is a need for such flexible membranes that form reliable electrical connections even where the conductive adhesive members are covered by the non-conductive adhesive. It is desirable that electronic devices employing such flexible membranes be operable in environments including repetitive thermal cycling over a wide temperature range, including where the coefficients of thermal expansion of the electronic components and the substrates on which they are mounted differ substantially.

The present invention comprises a pattern of a plurality of electrically conductive features formed of a flexible electrically conductive adhesive having a predetermined flowability; and an electrically insulating matrix surrounding and adhering to the plurality of electrically conductive features, the electrically insulating matrix being a membrane formed of a flexible electrically insulating adhesive having a greater flowability than that of the flexible electrically conductive adhesive.

According to another aspect of the present invention, an electronic device comprises an electronic component having a pattern of electrical contacts on one surface thereof and a substrate having a pattern of electrical contacts on one surface thereof corresponding to the pattern of electrical contacts on the electronic component. A flexible adhesive membrane attaching the electronic component to the substrate comprises a plurality of electrically conductive features in a pattern corresponding to the pattern of electrical contacts and forming respective electrical connections between corresponding ones of the electrical contacts on the electronic component and on the substrate, the plurality of electrically conductive features formed of a flexible electrically conductive adhesive having a predetermined flowability. An electrically insulating matrix surrounds and adheres to the plurality of electrically conductive features, the electrically insulating matrix being a membrane formed of a flexible electrically insulating adhesive having a greater flowability than that of the flexible electrically conductive adhesive.

A method employing a flexible membrane to test flip-chip electronic components according to a further aspect of the invention comprises:

- obtaining a flip-chip electronic component to be tested, the electronic component having a pattern of electrical contacts thereon;
- obtaining a flexible membrane including a matrix of a flexible electrically insulating adhesive having a pattern of electrically conductive features therein formed of a flexible electrically conductive adhesive adhering to the flexible electrically insulating adhesive matrix, wherein the pattern of electrically conductive features of the flexible membrane corresponds to the pattern of electrical contacts on the electronic component;
- applying the flexible membrane to the electronic component with ones of the pattern of electrical contacts electrically connecting to respective corresponding ones of the pattern of electrically conductive features;
- obtaining a test apparatus having a plurality of electrical test probes connected thereto for testing electronic components;
- connecting the electronic component to the test apparatus by touching selected ones of the test probes to selected ones of the electrically conductive features of the flexible membrane; and
- operating the test apparatus to test the electronic component.

BRIEF DESCRIPTION OF THE DRAWING

The detailed description of the preferred embodiments of the present invention will be more easily and better understood when read in conjunction with the FIGURES of the Drawing which include:

FIG. 11 is a table displaying characteristics of certain insulating and conductive adhesives employed with the present invention.

DESCRIPTION OF THE PREFERRED EMBODIMENT

Figure 1:
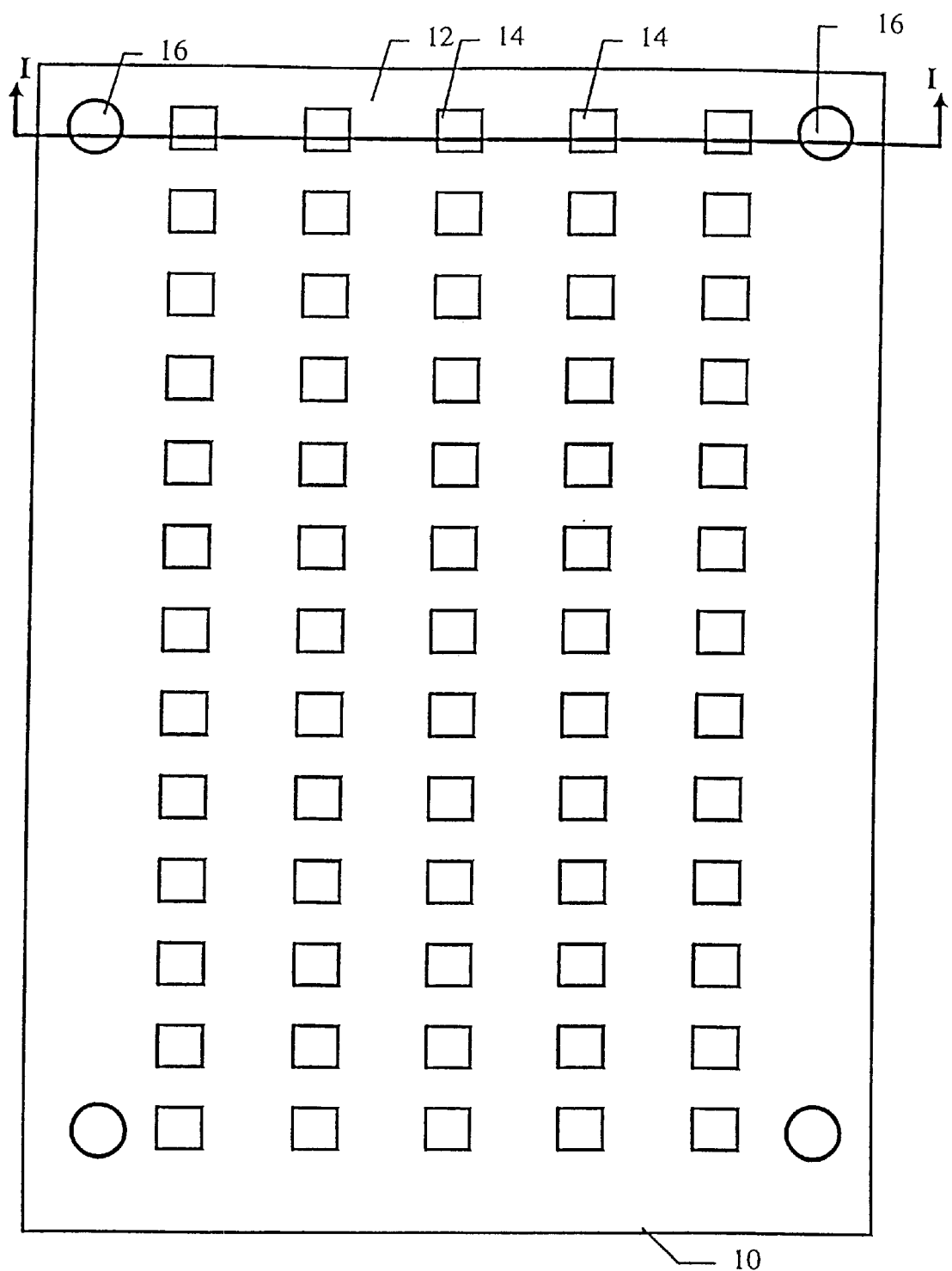
FIG. 1 is a plan view of a flexible membrane according to the present invention.

FIG. 1 is a plan view of a flexible membrane 10 according to the present invention in which a sheet or membrane 12 of a flexible electrically insulating adhesive material includes a pattern of flexible electrically conductive adhesive features 14 therethrough between a top surface and a bottom surface thereof. The pattern of flexible conductive features is arranged to correspond to a pattern of passivated contact pads, for example, on an electrical or electronic component, such as a semiconductor die, integrated circuit, transistor, diode, chip resistor, chip capacitor, chip inductor or other electronic device or component, or on an electronic board or substrate, onto which the flexible membrane 10 is intended to be affixed. Each of the features of flexible conductive adhesive 14 may be employed to form an electrical interconnection between a contact on an electronic device and a contact on a substrate onto which such electronic component is attached.

Flexible membrane 10 further includes a plurality of relational alignment holes 16 arranged in known predetermined relationship to the pattern of flexible conductive adhesive features 14 for assisting in positioning the flexible membrane 10 on an electronic component, device or substrate. To that end, such electronic component, device or substrate also includes a corresponding plurality of relational alignment holes arranged in the same known predetermined relationship to the pattern of contact pads thereon, which is the same as the pattern of flexible conductive adhesive features 14 on flexible membrane 10, for assisting in positioning the flexible membrane 10 thereon. While an exemplary rectangular array of regularly-spaced flexible adhesive features 14 (e.g., contact pads) are illustrated, it is understood that any pattern and/or irregular spacing thereof may be employed on the electronic component, device or substrate, and that the pattern of flexible conductive features 14 on flexible membrane 10 will generally correspond thereto.

Figure 2:
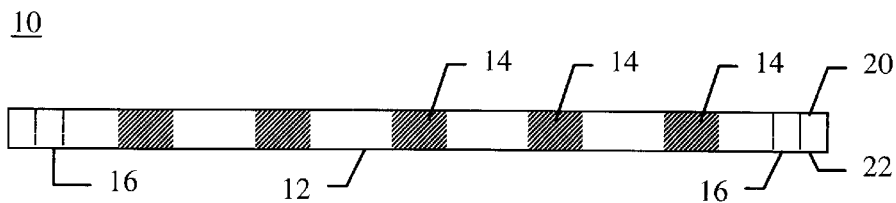
FIGS. 2, 3, 4 and 5 are respective cross-sectional diagrams of alternative embodiments of the flexible membrane of FIG. 1.

FIG. 2 is a cross-sectional diagram of one exemplary embodiment of the flexible membrane 10 taken at section line I—I of FIG. 1. Therein, flexible conductive adhesive features 14 form electrically-conductive paths through flexible adhesive matrix or membrane 12 between the top and bottom surfaces 20, 22, respectively, of flexible membrane 10. Flexible conductive adhesive features 14 are of substantially uniform width and height, and may be formed as a single layer, as is flexible adhesive matrix 12, as described below.

According to one aspect of the present invention, the flow characteristics or flowability of the respective flexible adhesives forming flexible insulating matrix 12 and flexible conductive adhesive features 14 are controlled so that the adhesive forming the flexible insulating matrix has a greater flow or flowability than does the adhesive forming the flexible conductive features 14. Each adhesive material has a melt flow temperature Tm at which it changes from a solid state to a flowable liquid state, albeit perhaps a very high viscosity liquid. For a thermoplastic material, for example, Tm is the temperature at its melting point. This differential flow characteristic may be obtained, for example, by employing an insulating adhesive that has a lower Tm than does the conductive adhesive with which it is utilized to form a flexible membrane 10. On the other hand, insulating and conductive adhesive materials having substantially the same Tm may be utilized in a flexible membrane 10 where the insulating adhesive is more flowable, i.e. is less viscous, than is the conductive adhesive at a given temperature above Tm. Each adhesive also has a bonding temperature Tb at which it functions as an adhesive to bond to objects with which it is in contact, and the bonding temperature Tb of a given adhesive is always a higher temperature than is the melt flow temperature Tm thereof. Both the flexible conductive adhesives and the flexible insulating adhesives, whether thermosetting or thermoplastic, will flow under the nominal temperature and pressure conditions required for them to adhere and bond to objects with which they are in contact.

Because the insulating adhesive in the flexible membrane 10 according to one aspect of the present invention has greater flow or flowability than does the conductive adhesive therein, it flows "first" and the conductive adhesive predominates or pushes aside the insulating adhesive. As a result, the conductive adhesive feature 14 will push through or penetrate any insulating adhesive between it and the contact to which it is to attach thereby making a reliable electrical connection to the contact even where the insulating adhesive covers the conductive adhesive feature 14. This feature overcomes a serious shortcoming of prior art preforms for which it is critical that not even one of the conductive contacts be covered by any insulating adhesive. Accordingly, it is not necessary for the conductive adhesive features 14 of the present invention to extend beyond the insulating matrix 12, or have a special shape such as a conical or a domed shape, as is required for prior art preforms. In fact, it is preferred that the conductive adhesive portion and the insulating adhesive portions have substantially the same thickness.

In addition, the greater flow of the insulating adhesive matrix 12, both under conditions of lamination to an electronic component or a substrate or of the bonding thereof, tends to eliminate voids at its interface with the electronic component or substrate to which it is attached, thereby forming a more intimate bond which provides better thermal coupling and better thermal conductivity to better transfer heat between the electronic component and the substrate through the flexible membrane 10. Another benefit of this greater flow is that it tends to improve the ability of the flexible insulating adhesive to serve as an underfill that absorbs some of the stress on the flexible conductive adhesive interconnections, such as stress resulting from temperature changes, which stress is already reduced by the flexibility of the respective adhesives employed. The greater flow further tends to allow the formation of fillets of the flexible insulating adhesive along the edges of the electronic component attached to a substrate, thereby to provide a seal that is resistant to the intrusion of water or other foreign materials between the electronic component and the substrate. Moreover, the lesser flow of the flexible conductive adhesive tends to reduce the possibility of shorting between adjacent conductive features.

Each insulating and conductive adhesive material also has a glass transition temperature Tg below which it has a high modulus of elasticity and is "rigid" and above which is has a substantially lower modulus of elasticity and is flexible. Adhesives such as rigid epoxies and solder having a high modulus of elasticity, for example, one million or greater, and a high glass transition temperature Tg, for example 70° C., form rigid interconnections that tend to fracture under the stress of thermal cycling, particularly where the respective coefficients of thermal expansion (CTE) of the two objects being interconnected differ markedly. For example, silicon semiconductors has a CTE of about 3 ppm/° C. as compared to about 17 ppm/° C. for a typical FR4 printed circuit board material. Accordingly, it is preferred that the adhesives employed in the present invention have a Tg below about 20–25° C. and a modulus of elasticity less than 100,000 psi at temperatures above Tg. It is further preferred that the adhesives have a modulus of elasticity less than 100,000 over a substantial portion, for example, at least 50%, of the temperature range over which the electronic devices are specified to experience in operation and storage.

Figure 3:
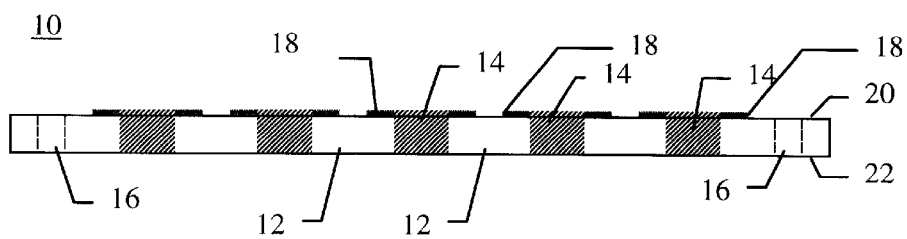

FIG. 3 is a cross-sectional diagram of another exemplary embodiment of the flexible membrane 10 taken at section line I—I of FIG. 1. Therein, flexible conductive adhesive features 14 form conductive paths through flexible adhesive matrix 12 between the top and bottom surfaces 20, 22, respectively, of flexible membrane 10 as in the embodiment of FIG. 2. However, in the embodiment of FIG. 3, flexible conductive adhesive features 14 are not of substantially uniform width. In particular, flexible conductive adhesive features 14 have an enlarged-area contact 18 on one surface of flexible membrane 10, for example, top surface 20 thereof, that is substantially larger than the cross-sectional area of flexible adhesive 14 where it passes through flexible adhesive matrix 12. One advantage of increased-size contact 18 of flexible conductive adhesive feature 14 is that the strength of the adhesion bond of flexible conductive adhesive features 14 to flexible adhesive matrix 12 of flexible membrane 10 is correspondingly increased. This arrangement may also be advantageous where the contacts on the electronic component, device or substrate with which flexible membrane 10 is to be employed are small or their aggregate area is only a small portion of its total area. It is noted that conductive flexible adhesive feature 14 including enlarged contact 18 may be formed as a single layer, as is flexible adhesive matrix 12, as described below and that contact 18 need not extend a substantial distance above the surface of flexible adhesive 12. It is preferred that if contact 18 extends above top surface 20 that it not extend more than a nominal distance, perhaps 10–20 microns and less than 20% of the thickness of flexible membrane 10. It is also noted that relational alignment holes 16 remain located in known predetermined relationship to the pattern of flexible conductive adhesive features 14.

The embodiments of flexible membrane 10 described in relation to FIGS. 1, 2 and 3 are particularly useful where the patterns of contacts on the electronic device or component are the same as the corresponding pattern of contacts on the substrate to which such electronic device or component is to be attached by flexible membrane 10. The contacts on the electronic device or component are electrically connected to the corresponding contacts of the substrate via the conductive paths provided by flexible conductive features 14 of flexible membrane 10, and the electronic device or component is further adhered to the substrate by flexible adhesive 12 of flexible membrane 10.

In other cases, however, it may be advantageous that the pattern of contacts on the substrate side of flexible membrane 10 differ from that on the electronic device or component side thereof. One example of such case is where the substrate is constructed of a low-cost material or by a process that cannot replicate the fine size or the fine pitch (i.e. center-to-center spacing) of the contacts on the electronic device or component that is to be attached thereto. Another example is where it is desired to electrically probe the electronic device or component, such as for purposes of testing, but the size or spacing of the contact pads thereon are too fine or too delicate to be safely and reliably probed directly by available electro-mechanical probes. In such cases, it is desirable to have a pattern of the flexible conductive adhesive features 14 of flexible membrane 10 that corresponds to the pattern of the contacts of the electronic device or component on one surface, for example, bottom surface 22, of flexible membrane 10, but that are substantially larger or are spaced further apart, or both, on the opposite surface 20 thereof.

Figure 4:
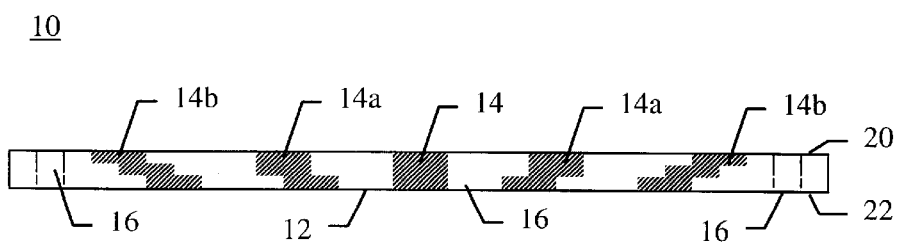

In the exemplary embodiment of flexible membrane 10 shown in FIG. 4, opposite ends of ones of flexible conductive adhesive features 14 are displaced laterally from each other on top surface 20 with respect to bottom surface 22. In the exemplary arrangement illustrated, flexible conductive adhesive features 14a which are closer to the periphery of flexible membrane 10 are built up layer by layer and are displaced to a greater extent towards that periphery than are flexible conductive adhesive features 14b which are not as close to that periphery and are also built up layer by layer. Flexible conductive adhesive features 14 that are more centrally located in flexible membrane 10 are not displaced laterally. The result is that the pattern of the ends of flexible conductive adhesive features 14, 14a, 14b at top surface 20 of flexible membrane 10 "fan out" or are expanded or enlarged from the pattern of the opposite ends of flexible conductive adhesive features 14, 14a, 14b at bottom surface 20 thereof. It is noted that relational alignment holes 16 remain located in known predetermined relationship to the pattern of flexible conductive adhesive features 14, 14a, 14b, and preferably to the pattern having the finer spacing and/or pitch, e.g., the pattern on the bottom surface 22 in FIG. 4.

Figure 5:
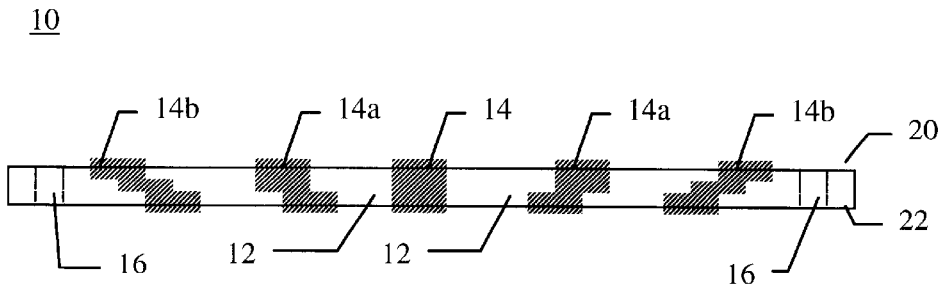

In the exemplary embodiment of flexible membrane 10 shown in FIG. 5, opposite ends of ones of flexible conductive adhesive features 14 are displaced laterally from each other on top surface 20 with respect to bottom surface 22 thereof, as was the arrangement in the embodiment of FIG. 4. In the exemplary arrangement illustrated, flexible conductive adhesive features 14a which are closer to the periphery of flexible membrane 10 are built up layer by layer and are displaced to a greater extent towards that periphery than are flexible conductive adhesive features 14b which are not as close to that periphery and are also built up layer by layer. Flexible conductive adhesive features 14 that are more centrally located in flexible membrane 10 are not displaced laterally. The result is that the pattern of the ends of flexible conductive adhesive features 14, 14a, 14b at top surface 20 of flexible membrane 10 fan out from the pattern of the opposite ends of flexible conductive adhesive features 14, 14a, 14b at bottom surface 20 thereof. In this arrangement, however, the ends of flexible conductive adhesive features 14, 14a, 14b protrude slightly above the top and bottom surfaces 20, 22, respectively, of flexible membrane 10 by an incidental amount, such as about 10–20 microns or less than about 20% of the thickness of flexible membrane 10. It is again noted that relational alignment holes 16 remain located in known predetermined relationship to the pattern of flexible conductive adhesive features 14.

Figure 6A:
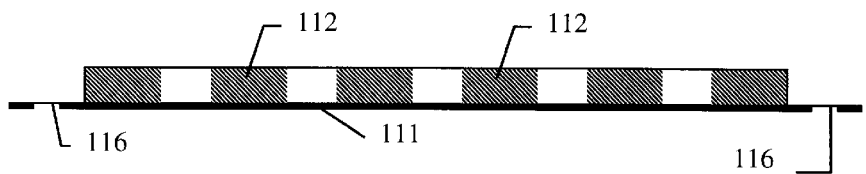
FIGS. 6A through 6C are cross-sectional diagrams showing various stages in an exemplary fabrication of the membranes of FIGS. 2, 3 and 4.
Figure 6B:
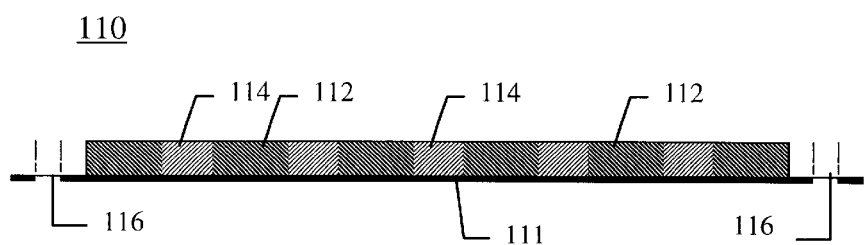
Figure 6C:
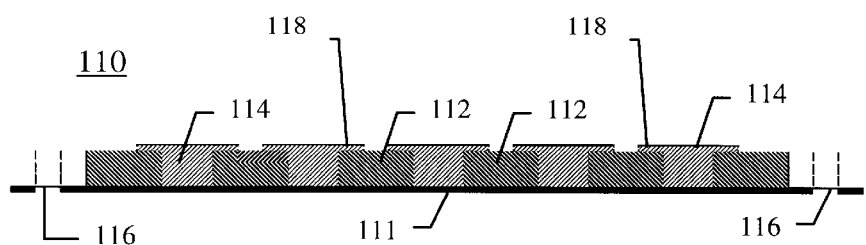

The fabrication of the flexible membranes of FIGS. 1–3 is described in relation to FIGS. 6A through 6C. First, a sheet of flexible insulating adhesive film or sheet 112 is obtained and a pattern of holes 113 are formed therethrough, such as by die cutting, corresponding to the pattern of contacts on the semiconductor device or other electronic component on which the completed flexible membrane is to be attached, as shown in FIG. 6A. Relational alignment holes 116 are formed by the same die cutting operation. Die cutting of features into a sheet of insulating adhesive is satisfactory for flexible membranes having relatively coarse features, e.g., features larger than about 750–800 microns. Alternatively, a liquid flexible adhesive 112 may be deposited onto a release liner 111, such as a paper, Teflon® tetrafluoroethylene, polyethylene, silicone-coated paper or the like release liner, using a stencil, screen or mask to define the pattern of holes 113 therethrough as above, and including relational alignment holes 116 in release film 111 in known predetermined position in relation to the pattern of holes 113. This method is satisfactory for flexible membranes having fine features, e.g., features of about 125 microns and larger. Thus, the insulating matrix of flexible adhesive is formed and is ready to receive flexible conductive adhesive in each of the aforementioned holes 113. In FIG. 6B, holes 113 in flexible adhesive matrix 112 are filled with a flexible conductive adhesive 114, such as by deposition through a stencil or mask having the appropriate pattern of apertures therethrough and positioned using the relational alignment holes 116. Because the flexible conductive adhesive shrinks when it dries or is B-staged, the thickness of the stencil or mask is selected so that the top of the dried or B-staged flexible conductive adhesive 114 is substantially co-planar with the top surface 20 of the flexible adhesive matrix 112 in the finished flexible membrane 110. Alternatively, as shown in FIG. 6C, the stencil or mask through which flexible conductive adhesive 114 is deposited may have a greater thickness and have apertures that are larger than the holes 113 in flexible adhesive matrix 112. I.e. the thickness and aperture size are selected so that the dried or B-staged flexible conductive adhesive will extend over the flexible adhesive matrix 112 surrounding hole 113 to form a contact 118 that extends slightly above the top surface 120 of flexible membrane 110, thereby forming the embodiment thereof shown in FIG. 3. Flexible membranes 110 are removed from the release liner 111 prior to storage and use, but may be stored on release liner 111 if desired.

Figure 7A:
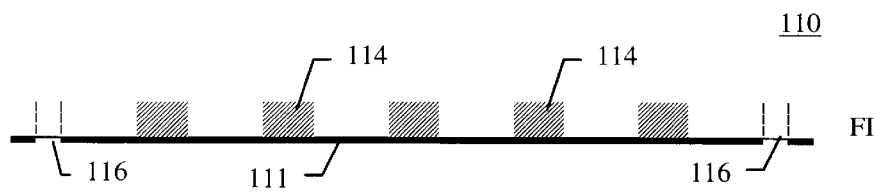
FIGS. 7A through 7B are cross-sectional diagrams showing various stages in an alternative fabrication of the membranes of FIGS. 2, and 3.
Figure 7B:
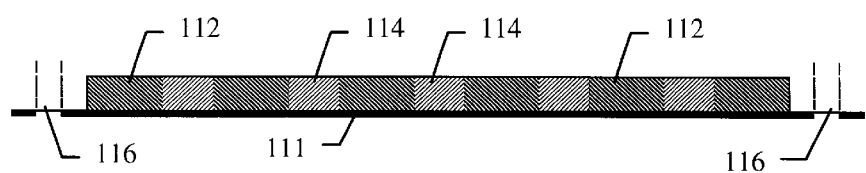

An alternative process for the fabrication of the flexible membranes of FIGS. 1–3 is described in relation to FIGS. 7A through 7B. First, a pattern of flexible conductive adhesive features 114 are deposited onto a release film 111 as shown in FIG. 7A, such as a paper, Teflon® tetrafluoroethylene, polyethylene, silicone-coated paper or the like release liner, such as by deposition through a stencil or mask having the appropriate pattern of apertures therethrough corresponding to the contacts on the semiconductor device or other electronic component with which the finished flexible membrane is to be used, and positioned using relational alignment holes 116 in release film 111 which are in known predetermined position with respect to the pattern of flexible conductive adhesive features 114. These conductive adhesive features may be extra-fine features having dimensions as small as 25 microns or may be substantially larger, e.g., perhaps 100–1000 microns. An insulating flexible adhesive 112 is then deposited onto release liner 111 through a stencil screen or mask that is positioned using relational alignment holes 116 or by roll coating. Because the flexible adhesive 112 shrinks when it dries or is B-staged, the thickness of the stencil or mask is selected so that the top of the dried or B-staged flexible adhesive 112 is substantially co-planar with the top surface 20 of the flexible conductive adhesive features 114 in the finished flexible membrane 110, as shown in FIGS. 2 and 7B. Note that because the insulating flexible adhesive has a greater flow than does the flexible conductive adhesive, the flexible insulating adhesive will be forced away from the tops of flexible conductive adhesive features 114 during attachment to a device or substrate, and so it is not particularly important that the flexible conductive adhesive features 114 not be covered by a thin layer of flexible insulating adhesive 112, as is the case in prior art preforms, such as those described by Bolger. In fact, it is usual that some flexible insulating adhesive 112 cover at least some of the flexible conductive adhesive features 114 on at least one side of flexible membrane 110.

Alternatively, an additional deposition of flexible conductive adhesive 114 may be applied using another stencil or mask having apertures that are larger than the size of the flexible conductive adhesive features 114 and in the same pattern as such features, and also positioned using relational alignment holes 116. The thickness and aperture size of this last stencil or mask are selected so that the dried or B-staged flexible conductive adhesive will extend over the flexible adhesive matrix 112 surrounding flexible conductive adhesive features 114 to form a contact 118 that extends slightly above the top surface 120 of flexible membrane 110, thereby forming the embodiment thereof shown in FIG. 3. Flexible membranes 110 are removed from the release liner 111 prior to storage and use, but may be stored on release liner 111 if desired.

While the relational alignment holes 116 are particularly useful for aligning large flexible membranes 110 onto semiconductor wafers and/or panels of substrates before the dicing or excising thereof into individual units and for aligning stencils and masks on such wafers and panels, flexible membranes 110 for individual units may be placed onto an individual electronic component or substrate that is preheated to a temperature high enough for the flexible adhesive membrane to flow for individual lamination and subsequent bonding thereto, with the alignment thereof being performed, for example, using suitable optical alignment equipment.

Figure 8A:
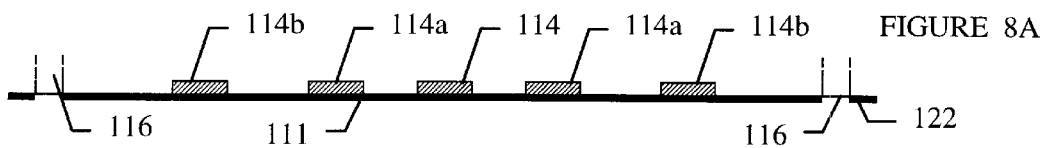
FIGS. 8A through 8E are cross-sectional diagrams showing various stages in the fabrication of the membranes of FIGS. 4 and 5.
Figure 8B:
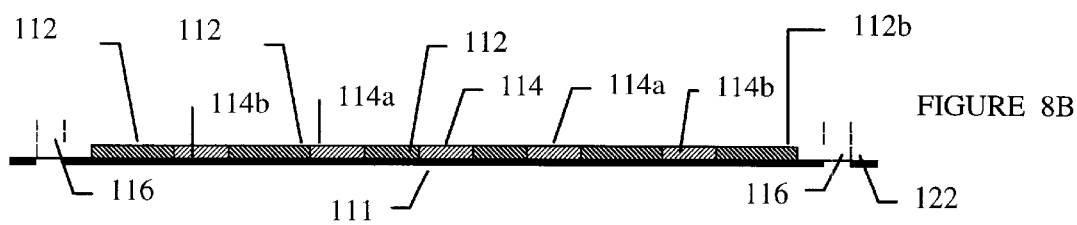

The fabrication of the flexible membranes of FIGS. 4–5 is described in relation to FIGS. 8A through 8E. First, a layer of liquid flexible conductive adhesive is deposited onto a release liner 111, such as a paper, Teflon® tetrafluoroethylene, polyethylene, silicone-coated paper or the like release liner, using a stencil, screen or mask having the appropriate pattern of apertures therethrough corresponding to the contacts on the semiconductor device or other electronic component with which the finished flexible membrane is to be used. This pattern of apertures defines the pattern of conductive features or contacts 114, 114a, 114b, of the bottom surface 122 of flexible membrane 110 as above, and including relational alignment holes 116 in release film 111 in known predetermined position in relation to the pattern of contacts 114, 114a, 114b. This first deposit of conductive features is dried or B-staged at about 60–80° C. A layer of insulating flexible adhesive 112 is then deposited onto release liner 111 in areas not occupied by conductive features 114, 114a, 114b, such as through a stencil, screen or mask that is positioned using relational alignment holes 116 or by roll coating. Because the flexible adhesive 112 shrinks when it dries or is B-staged, for example, at about 60–80° C., the thickness of the stencil or mask through which it is deposited is selected so that the top of the dried or B-staged flexible adhesive 112 is substantially co-planar with the top surface of the layer forming flexible conductive adhesive features 114, 114a, 114b, in the first layer of flexible membrane 110, as shown in FIG. 8B. This method is satisfactory for flexible membranes having fine features, e.g., features of about 25 microns and larger, or may be substantially larger, e.g., perhaps 100–1000 microns.

Figure 8C:
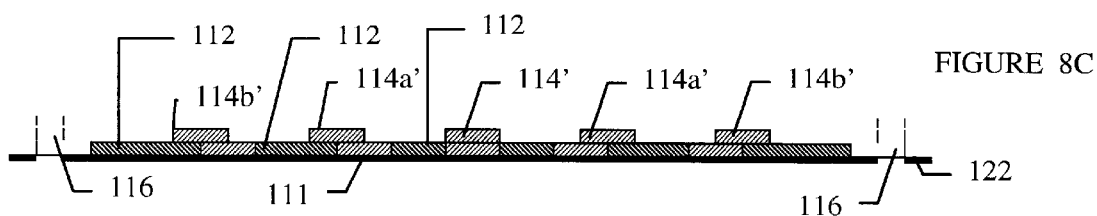
Figure 8D:
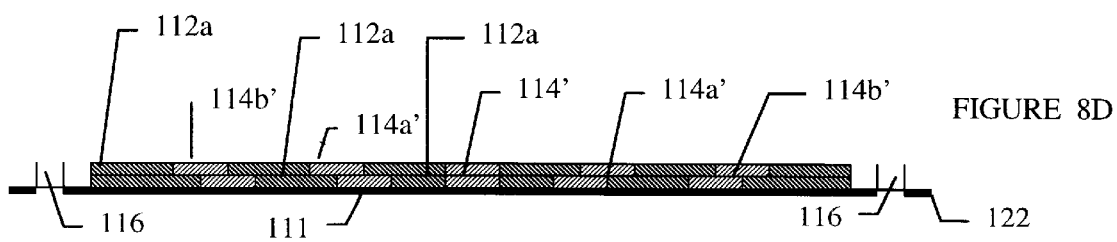

Next, a second layer of flexible conductive adhesive is deposited, such as through another stencil, screen or mask, to form conductive features 114', 114a', 114b' that overlie, at least in part, and therefore electrically connect to conductive features 114, 114a, 114b in the first layer of flexible membrane 110, as shown in FIG. 8C. Conductive features 114' which are closest to the periphery of flexible membrane 110 are displaced outwardly towards that periphery, in accordance with the pattern of apertures in the stencil, screen or mask through which it is deposited. This second deposit of conductive features is dried or B-staged at about 60–80° C. A second layer of insulating flexible adhesive 112a is then deposited onto the first layer of insulating adhesive 112 and conductive features 114, 114a, 114b in areas not occupied by conductive features 114', 114a', 114b', such as through another stencil, screen or mask that is positioned using relational alignment holes 116 or by roll coating. Similarly, flexible adhesive 112a shrinks when it dries or is B-staged and the thickness of the deposit thereof is selected so that the top of the dried or B-staged flexible adhesive 112a is substantially co-planar with the top surface of the second layer forming flexible conductive adhesive features 114', 114a', 114b' in the second layer of flexible membrane 110, as shown in FIG. 8D.

Figure 8E:
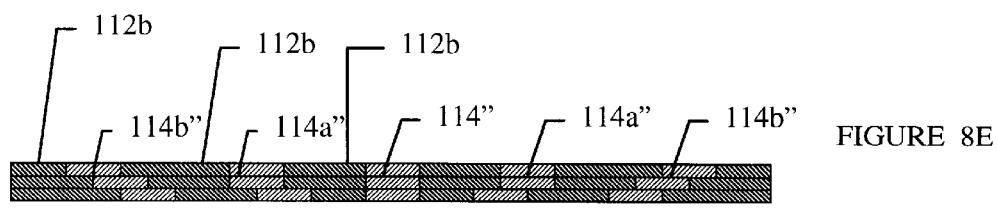

Next, a third layer of flexible conductive adhesive is deposited, such as through another stencil, screen or mask, to form conductive features 114", 114a", 114b" that overlie, at least in part, and therefore electrically connect to conductive features 114', 114a', 114b' in the second layer of flexible membrane 110. Conductive features 114b" which are closest to the periphery of flexible membrane 110 are further displaced outwardly towards that periphery, in accordance with the pattern of apertures in the stencil, screen or mask through which they are deposited. This third deposit of conductive features is dried or B-staged. A third layer of insulating flexible adhesive 112b is then deposited onto the second layer of insulating adhesive 112a and conductive features 114', 114a', 114b' in areas not occupied by conductive features 114", 114a", 114b", such as through another stencil, screen or mask that is positioned using relational alignment holes 116 or by roll coating. Similarly, flexible adhesive 112b shrinks when it dries or is B-staged and the thickness of the deposit thereof is selected so that the top of the dried or B-staged flexible adhesive 112b is substantially co-planar with the top surface of the third conductive layer forming flexible conductive adhesive features 114", 114a", 114b" in the third layer of flexible membrane 110, completing flexible membrane 110, as shown in FIG. 8E which may be removed from release liner 111.

The fabrication of the flexible membranes of FIG. 5 is the same as that described above in relation to FIG. 4 except that the third layer of insulating adhesive 112b is deposited to a slightly lesser thickness so that after it is dried or B-staged, its top surface is slightly below that of conductive features 114", 114a", 114b", for example, by less than about 20% of the thickness of flexible membrane 110. If it is desired that conductive features 114, 114a, 114b similarly extend outwardly from the bottom surface 122 of flexible membrane 110, then a further deposition of a thin pattern of conductive adhesive is made over conductive features 114, 114a, 114b having a thickness that, when dried or B-staged, projects from bottom surface 122 by about 20% of the thickness of flexible membrane 110.

It is noted that the temperature at which layers of flexible membrane 110 are dried or B-staged are below the curing temperature of the flexible adhesives of which it is made, which is appropriate where the finished membrane is to be employed for attaching electronic devices to a substrate. Where flexible membrane 110 is to be employed as a testing membrane that is, for example, placed over an electronic device for purposes of testing, the flexible membrane 110 may be raised to a higher temperature to cure the flexible adhesives of which it is made.

As above, it is not particularly important that the flexible conductive adhesive features 114, 114" 114a, 114a" 114b, 114b" not be covered by a thin layer of flexible insulating adhesive 112, 112b, as is the case in prior art preforms. In fact, it is usual that some flexible insulating adhesive 112, 112b cover at least some of the flexible conductive adhesive features 114, 114" 114a, 114a" 114b, 114b" on at least one side of flexible membrane 110, which insulating adhesive flows away to leave a good electrical connection when the membrane is employed to attach an electronic device to a substrate.

Figure 9:
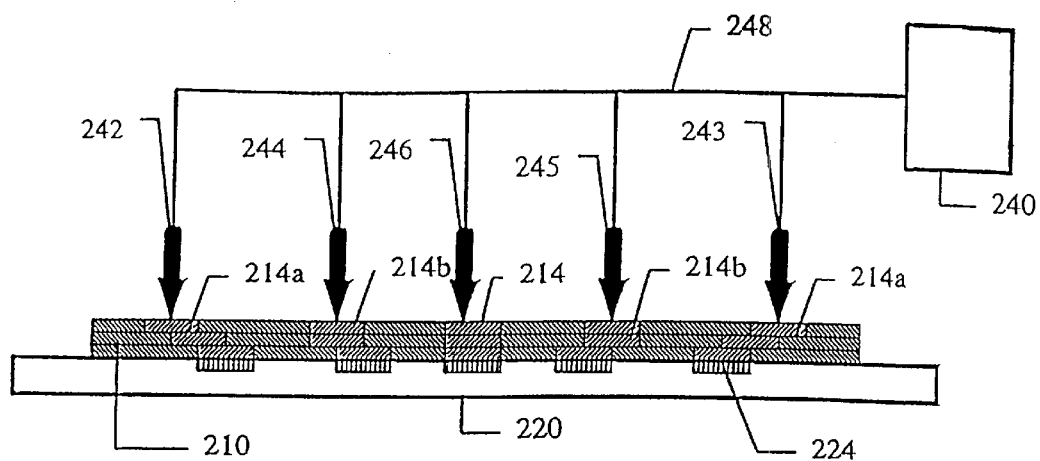
FIG. 9 is a schematic diagram of an exemplary electronic device employing a membrane according to the present invention arranged for testing.

A robust flexible adhesive membrane of the sort described herein can be applied or laminated onto the circuit side of a semiconductor wafer, wherein a pattern of conductive adhesive features on the flexible membrane connect to the corresponding contacts of the individual circuits on such wafer. Such flexible membrane will facilitate the probing, testing, and stressing of such semiconductor wafers, and the individual circuits formed therein, to permit both immediate confirmation to the wafer-fabricating operation of whether the semiconductor processing was satisfactory and subsequent selection of those individual circuits that are satisfactory, i.e. the "known-good-die" selection. It is anticipated that the cost of applying a flexible membrane to a six-inch diameter semiconductor wafer will be less than US$30 in volume, which is much less than the cost of separately testing each individual die. After the known-good-dies are selected and the wafer is diced, the flexible membrane attached to each individual die may be employed in bonding such dies to a substrate, replacing conventional solder connections and rigid adhesive underfill. FIG. 9 illustrates an exemplary probe and test application of a flexible membrane 210 which is of the sort shown in FIGS. 4 and 5 above. An electronic device 220, such as a microprocessor, memory chip or other integrated circuit, has a plurality of contact pads 224 that are disposed at a fine pitch, for example, 50–100 microns. Electrical testing apparatus 240, as may be employed for the testing, characterization and/or burn-in of electronic devices, includes a plurality of electrical probes 242, 243, 244, 245, 246 coupled via electrical conductors 248 for applying electrical signals to electronic device 240 and receiving electrical signals therefrom. Because the diameters of electrical probes 242, 243, 244, 245, 246 may be larger than the pitch of the contacts 224, or because it may not be practical to mount probes 242, 243, 244, 245, 246 at a close enough spacing, or both, it is not practical for electrical probes 242, 243, 244, 245, 246 to directly probe contacts 224 of electronic device 220. To overcome this problem, a flexible membrane 210 having a pattern of contacts 214, 214a, 214b on its bottom surface that corresponds to the pattern of contacts 224 of electronic device 220 is placed onto electronic device 220 so that the contacts 214, 214a, 214b thereof make electrical contact to the corresponding contacts 224. Flexible membrane 210 has a pattern of contacts 214, 214a, 214b on the top surface thereof that correspond to the contacts on its bottom surface, but which are fanned out to form an enlarged pattern to which electrical probes 242, 243, 244, 245, 246 may conveniently be directly probed. It is noted that while the pattern of contacts 214, 214a, 214b on the top surface of flexible membrane 210 are fanned out so that the pitch thereof is sufficiently large to permit direct probing by electrical probes 242, 244, 246, it is not necessary that the pattern thereof be the same as that on electronic device 220, only that there be a known one-to-one correspondence of the contacts 214, 214a, 214b to the contacts 224.

Figure 10:
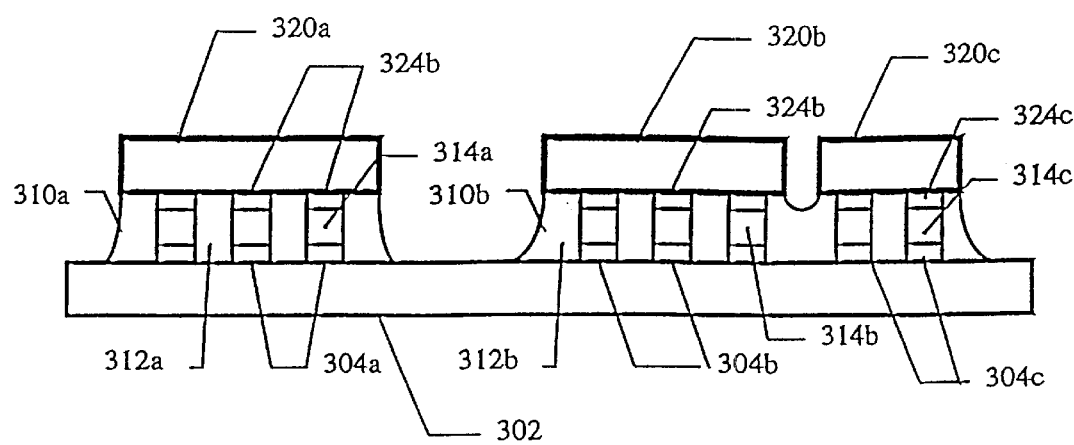
FIG. 10 is a diagram of exemplary electronic devices attached to a substrate and employing membranes according to the present invention.

FIG. 10 shows an electronic device 300 including a plurality of electronic components 320a, 320b, such as semiconductor devices, chip resistors, chip capacitors or other electronic components, mounted to a substrate 302. Each electronic component 320a, 320b includes a respective pattern of contacts 324a, 324b for making electrical connections thereto. Substrate 302 includes patterns of contacts 304a, 304b corresponding respectively to the patterns of contacts 324a, 324b on electronic components 320a, 320b, respectively, ones of which contacts are connected to other contacts and other components (not shown) for forming a useful electronic circuit on substrate 302. Flexible membranes 310a, 310b are attached to electronic components 320a, 320b, respectively, making electrical contact with the contacts 324a, 324b thereon. Flexible membranes 310a, 310b are also attached to substrate 302 thereby attaching electronic components 320a, 320b, respectively, thereto and making electrical contact with the contacts 304a, 304b thereon. Accordingly, contacts 324a, 324b are electrically connected to contacts 304a, 304b, respectively, through the flexible conductive adhesive features of flexible membranes 310a, 310b, respectively. While the patterns of contacts on electronic components 320a and 320b correspond to the patterns of contacts 304a and 304b on substrate 302, they may be in differing arrangements, for example, a fan-out arrangement as described above.

EXAMPLE 1

Flexible adhesive matrix 12 of flexible membrane 10 of FIG. 2 or 3 is made from an insulating thermosetting adhesive film, such as the standard insulating film adhesive type ESP7450 available from AI Technology, Inc., located in Princeton, N.J. Openings having about a 750 micron diameter are cut into a flexible adhesive film 12 having a thickness of about 150 microns by die cutting. Die cutting is low cost and satisfactory for features larger than about 1000 microns, including very large features, perhaps up to as large as 1000 to 10,000 microns or even larger. Alternatively, the insulating matrix 12 may also be formed from the liquid version of the same insulating adhesive material type LESP7450 by screening, stenciling or other deposition technique. The viscosity of this insulating adhesive is designed to be about 200,000 cp at 0.5 rpm and about 80,000 cp at 5 rpm and the thixotropic index, i.e. the ratio of these two viscosities, is about 2.5, for precise control of lateral dimensions. The flexible conductive adhesive features 14 are made by backfilling the openings in insulating matrix 12 with a suitable flexible conductive adhesive, such as ESP8450 or its liquid version LESP8450, both available from AI Technology, using a stencil or mask. The finished flexible membrane 10 of FIG. 2 or 3 is about 150 microns thick and is dry to the touch after the flexible adhesives are B-staged and dried at 60–80° C. for about 30 minutes, after which is may be used or stored for later use. Insulating adhesives types ESP7450 and LESP7450 have a melt flow temperature of about 80° C. and flexible conductive adhesives types ESP8450 and LESP8450 have a higher melt flow temperature of about 120° C. One preferred use is to first laminate this flexible membrane 10 onto an electronic substrate, preferably onto a panel of substrates having repetitive patterns of contacts before the panel is separated into individual substrates. This lamination is performed at a temperature of about 80–125° C. with pressure (i.e. compression) of about 10 psi for only a few seconds, for example, about two seconds, so as to not create excessive B-staging that would render the adhesive unsatisfactory for assembly of the electronic component to the next level board substrate. This flexible membrane 10 is dimensionally stable and robust and so may be probed with electrical probes when an god electrical component is operated at stress temperatures below about 80° C., such as for burn-in or other electrical testing. Final assembly of the electronic component and flexible membrane onto a substrate is performed at about 100–200° C. and a pressure of about 10 psi for a few seconds. Further curing, if desired, may be performed without the external pressure. Because of higher flow characteristic of insulating adhesive matrix 12, it provides a natural underfill-like protection of the electronic component by forming a fillet along the edges thereof to protect the flexible conductive adhesive interconnections, for example, from chemical washing solvents and moisture.

EXAMPLE 2

Flexible adhesive matrix 12 of flexible membrane 10 of FIG. 2 or 3 is made from an electrically-insulating thermally-conductive thermosetting adhesive such as the insulating adhesive type ESP7555 or its liquid version LESP7555 available from AI Technology, Inc., located in Princeton, N.J. These electrically-insulating adhesives are heavily loaded with thermally-conductive particles, i.e. alumina particulate, to enhance the thermal conductivity thereof. Openings having about a 100 micron diameter and a 200 micron pitch are made in flexible adhesive film 12 having a thickness of about 75 microns during the deposition thereof, such as by screening, stenciling or other deposition technique. The viscosity of this insulating adhesive is designed to be about 200,000 cp at 0.5 rpm and about 80,000 cp at 5 rpm and the thixotropic index, i.e. the ratio of these two viscosities, is about 2.5, for precise control of lateral dimensions. The flexible conductive adhesive features 14 are made by backfilling the openings in insulating adhesive matrix 12 with a suitable conductive adhesive such as ESP8450 or its liquid version LESP8450. The finished flexible membrane 10 is about 75 microns thick and is dry to the touch after the paste adhesives are dried or B-staged at 60–80° C. for about 30 minutes. Preferably, there is a slight overhang 18 of the conductive pads 14 on one side of the membrane 10 to facilitate adhesion between the contact pads 14 and insulating adhesive matrix 12, as in the embodiment of FIG. 3. Insulating adhesives types ESP7555 and LESP7555 have a melt flow temperature of about 80° C. and flexible conductive adhesives types ESP8450 and LESP8450 have a higher melt flow temperature of about 120° C. Although flexible membrane 10 may be employed to bond flip chips and other electronic components in many different ways, one preferred way is to first laminate a flexible membrane 10 onto the circuit side of a processed semiconductor wafer, perhaps a 6-inch or 8-inch diameter wafer having hundreds or thousands of integrated circuits or other semiconductor devices formed thereon. The relational alignment holes 16 of flexible membrane 12 are brought into alignment with a corresponding set of relational alignment holes in the semiconductor wafer that are located in the same known predetermined relationship with the patterns of contacts on the semiconductor wafer, which relational alignment holes may be formed by laser machining or drilling. Preferably, this lamination is performed before the semiconductor wafer is diced or separated into individual semiconductor devices and is performed at a temperature of about 80–125° C. with pressure of about 10 psi for only a few seconds, so as to not create excessive B-staging that would render the adhesive unsatisfactory for assembly of the electronic component to the next level board substrate. This flexible membrane 10 is dimensionally stable and robust and so may be probed with electrical probes when an electrical component is operated at stress temperatures below about 80° C., such as for burn-in or other electrical testing. Final assembly of the electronic component and flexible membrane onto a substrate is performed at about 100–200° C. and a pressure of about 10 psi for a few seconds, for example, about two seconds. Further curing, if desired, may be performed without the external pressure. Because of higher flow characteristic of insulating adhesive matrix 12, it provides a natural underfill-like protection of the electronic component by forming a fillet along the edges thereof to protect the flexible conductive adhesive interconnections, for example, from chemical washing solvents and moisture, as is illustrated in FIG. 10. The substrate 302 therein in this example is FR4 with the semiconductor flip chips 320*a*, 320*b* having edge dimensions of 5.0 mm and larger.

EXAMPLE 3.

Example 3 is similar to that of Example 1 except that the thermosetting flexible conductive adhesive type ESP8450, LESP8450 is replaced by a thermoplastic flexible conductive adhesive type TP8150 in its liquid paste format of LTP8150, available from AI Technology. Adhesive type TP8150 flows and is cured at temperatures above about 200° C. as compared to the insulating matrix of thermosetting ESP7450 which will cure quickly at these higher temperatures. Accordingly, care must be exercised to keep the time of high-temperature exposure during the bonding process as short as possible, such as bonding at 210° C. for less than five seconds. Because of the thermosetting nature of the insulating matrix and its higher flow characteristic, the flexible membrane is particularly suited for application onto the next level board substrate, for example, at an application temperature of about 125–150° C.

EXAMPLE 4

Example 4 is similar to of Example 1 except that flexible insulating adhesive type ESP7450 and flexible conductive adhesive type ESP8450 are replaced by flexible insulating adhesive type TP7150 and flexible conductive adhesive type TP8150, respectively, in their respective liquid dispensable versions types LTP7150 and LTP8150. respectively. In this example, both flexible insulating matrix 12 and flexible conductive adhesive features 14 are made with thermoplastic adhesives having a melt-flow temperature of about 200° C. or greater. In this particular example, the flexible insulating matrix 12 does not provide enhanced thermal conductivity, but is unfilled so as to have a higher flow index at a given temperature as compared to that of the flexible electrically conductive adhesive features 14. As a result, fillets form around the edges of a semiconductor die when it is bonded to a substrate at about 210° C. with 10 psi pressure for less than 1 second. One preferred application of flexible membranes 10 according to this example is to laminate the flexible membrane 10 at 200° C. onto a semiconductor wafer which is then diced into individual semiconductor dies 320*a*, 320*b*, each having a flexible membrane 10 attached thereto. The chuck that picks up these dies for placement onto a substrate is preheated to around 250° C. while the next-level board substrate is maintained at about 150° C. so that bonding process can be performed quickly. The moisture resistance afforded by the fillet formed of the flexible insulating adhesive 12 helps to improve the reliability of the final electronic device. Because the flexible conductive adhesive features 14 and the flexible insulating adhesive matrix 12 are both thermoplastics, flexible membranes 10 of this example are particularly suitable for use directly in a chip-attachment process rather than for attachment to components that are sold for later attachment to a substrate.

EXAMPLE 5

Example 5 is a similar flexible adhesive membrane 10 to that of Example 3, except that in this example, the flexible conductive adhesive features 14 of flexible membrane 10 are about 100 by 100 microns, which is substantially larger in size than are the 50 by 50 micron contacts on the flip chip device to which they will be attached. Flexible conductive adhesive features 14 are formed of conductive adhesive type TP8150. The pitch between the flexible conductive adhesive features 14 of the membrane is about 200 microns which is the same as that of the contacts on the flip chip device even though the spacing therebetween is reduced, but the spacing between features 14 is at least 25 microns to assure adequate insulation between adjacent conductive features 14. This arrangement is particularly useful for devices having a small number of input and output connections wherein the increase in size of the conductive features makes alignment of the membrane to the electronic device easier and also provides increased current carrying capability, as is beneficial for a power semiconductor device.

EXAMPLE 6

Example 6 is similar in construction to flexible membrane 10 of Example 1 except that flexible conductive adhesive features 14 extend slightly above the top surface 20 of insulating matrix 12 on one side as illustrated in FIG. 3. The side that has the increased height of flexible conductive adhesive features 14 preferably contacts a semiconductor wafer and is attached thereto at a temperature of about 125° C. with pressure of about 10 psi. The bottom surface 22 of flexible membrane 10 which has flexible conductive adhesive features at even height with flexible insulating adhesive matrix 12 is preferably attached to the next level board substrate. An advantage of this arrangement is that because the flexible conductive adhesive features 14 have lesser flow than does the flexible insulating adhesive matrix 12, the flexible conductive adhesive features 14 predominate over and displace the flexible insulating adhesive matrix 12 and thus prevent open circuits that might otherwise be created if the insulating material of flexible matrix 12 were to remain covering a conductive adhesive feature during the flow bonding process. This arrangement is particularly advantageous for the wafer-side attachment because of the contacts on a semiconductor wafer are usually slightly recessed below the surface of the surrounding passivation layer.

EXAMPLE 7

Example 7 relates to the flexible membrane 10 of FIG. 4 which is particularly suited to an electronic device whose contacts have extremely fine pitch and spacing at the semiconductor wafer or die level that is to be attached to a substrate which is limited to a coarser pitch and spacing or that is to be probed for electrical testing. For example, semiconductor processing can achieve great precision, for example, contact pad pitch and spacing of about 25–50 crons whereas a printed wiring circuit board made with FR4 material typically can only achieve 75 micron contact pads and spacing and electrical test probes for semiconductor wafer-level testing have probe tips that are about 100 microns in diameter and have about 200–300 micron center-to-center spacing. In this example, the three-layer flexible membrane 10 is fabricated layer by layer with each layer having a thickness of about 25 microns, so the resulting flexible membrane 10 has about a 75 micron thickness. The flexible conductive adhesive features 14a, 14b thereof are slightly fanned out at each successive layer from the fine pitch and spacing of the pattern of contacts on the semiconductor devices to have at the top layer the same pattern, and therefore the same pitch and spacing, as that of the next level substrate. The slight increase in the length of the conductive path provided by flexible conductive adhesive features 14a, 14b is in most cases negligible and does not materially detract from the low inductance and capacitance afforded by the flip chip mounting arrangement.

EXAMPLE 8

Example 8 is a flexible membrane 10 similar to that of FIG. 5 in which the flexible conductive adhesive features 14 extend out of the flexible insulating adhesive matrix 12. The side of flexible membrane 10 that will be attached to the next level substrate has the flexible conductive adhesive features 14a, 14b fanned out to allow direct attachment onto the contact pads of the substrate, and the size of the flexible conductive features 14, 14a, 14b may also be substantially enlarged for easier placement of such flexible membrane 10 onto the substrate. This construction is particularly useful where flexible membrane 10 is to be attached onto a second-level substrate before placement of semiconductor die thereon. Thus both the flexible insulating matrix 12 and flexible conductive adhesive features 14, 14a, 14b can utilize the advantage being bonded several times by reheating and reflowing the thermoplastic-based adhesives types TP7150 and TP8150 which bond easily at 200–220° C. under a nominal pressure of about 10 psi for a time as short as one millisecond. In this particular example, flexible conductive adhesive features 14, 14a, 14b protrude an incidental distance out of both sides of flexible membrane 10 by about 10–15 microns above the flexible insulating adhesive matrix 12, however, it is also satisfactory that flexible conductive adhesive features 14, 14a, 14b extend only out one side thereof, for example, the side that will be attached to an electronic component such as a flip chip device. Both arrangements are satisfactory for probing with electrical probes for electrical testing.

EXAMPLE 9

Example 9 is the use of flexible membranes 310a, 310b of different composition in a single multi-chip electronic device 300, as illustrated in FIG. 10. In this example, the next level board substrate 302 is made of FR4 with multiple sites having patterns of contacts 304a, 304b similar to certain multiple chip modules employed in high-performance personal computers. The microprocessor circuits and the cache memory circuits are fabricated on respective semiconductor wafers that are then laminated with respective flexible membranes 310a, 310b having respective repetitive patterns of flexible conductive adhesive features 314a, 314b that correspond to the patterns of contact pads of the microprocessor and cache circuits, respectively. These laminated wafers are then diced into individual dies, i.e. individual microprocessor chips 320a and individual cache chips 320b, respectively, which are attached onto substrate 302 of the multi-chip module board 300. Because the microprocessor 320a consumes high power and requires a high-thermal-conductivity attachment to substrate 302, flexible membrane 310a employs the combination of alumina-filled thermally-conductive flexible insulating adhesive ESP7555 for insulating matrix 312a and electrically-conductive flexible adhesive TP8150 for flexible conductive adhesive features 314a. In the case of the cache memory 320b and other low-power chips, flexible membrane 310b employs flexible insulating adhesive ESP7450 and flexible conductive adhesive TP8150, respectively.

EXAMPLE 10

Example 10 is a flexible membrane fabricated according to the process shown in FIGS. 6A and 6B. The flexible insulating adhesive matrix 112 is first deposited on release substrate 111 in a position determined by the relational alignment holes 116 therein which are in the same known predetermined relationship to the pattern of features 114 as are corresponding relational alignment holes on the stencil or mask employed to deposit flexible insulating adhesive 112. Flexible insulating matrix 112 is formed of a deposition of flexible insulating thermosetting adhesive type LESP7450-SC available from AI Technology, Inc. with the places where the flexible conductive adhesive features 114 are to be deposited left open. The flexible conductive adhesive features 114 are then filled in by applying flexible conductive adhesive type LTP8150 through a stencil or mask that has relational alignment holes corresponding to those in the stencil or mask used in depositing the flexible insulating matrix 112 and to those in release substrate 111. The flexible insulating adhesive is applied wet through a stencil having at thickness of about 112 microns and is first B-staged at about 70° C. for about 60 minutes to obtain a ry thickness of about 75 microns. The stencil used for depositing the flexible conductive adhesive features has apertures of about 75 micron diameter and has a thickness of about 50 microns to deposit a wet thickness of 75+50=125 microns of flexible conductive adhesive which is dried at about 60–80° C. for about 30–60 minutes to obtain a total dry thickness of about 75–90 microns. Flexible conductive adhesive features 114 are about 75 microns in diameter at a pitch of about 150 microns.

EXAMPLE 11

Example 11 is a flexible membrane 110 that employs the same adhesive materials as in Example 10 and that is fabricated according to the process shown in FIGS. 6A and 6C. Flexible insulating adhesive matrix 112 is first deposited on the release substrate 111 and B-staged, followed by deposition and drying of flexible conductive adhesive features 114, using stencils and masks and alignment as described above. The difference from Example 10 is that the apertures through the stencil employed for the deposition of the flexible conductive adhesive for conductive features 114 have a diameter of 100 microns which is slightly larger than the 75 micron holes in flexible insulating adhesive matrix 112 so that there is a slight overhang 118 as shown in FIG. 6C having a diameter of about 100 microns and a thickness of about 75 microns. This overhang 118 helps to securely anchor the flexible conductive adhesive features 114 to flexible insulating adhesive matrix 110.

EXAMPLE 12

Example 12 is a flexible membrane 110 that employs the same materials as in Examples 10 and 11, but which employs a different sequence of deposition to fabricate an extra-fine pitch flexible membrane that has 75 micron diameter flexible conductive adhesive features 114 at a pitch of 150 microns. Conventional methods are incapable of making a suitable stencil for such fine mesh printing at low cost and a conventional emulsion screen will make the subsequent alignment for of stencils for depositing the insulating matrix or conductive features very difficult, so a new method was devised as follows. Patterns of flexible conductive adhesive features 114 are formed by first depositing flexible conductive adhesive type LTP8150 with wet thickness of about 75 microns onto a suitable release substrate 111, such as a Teflon® film available from E. I. duPont de Nemoirs located in Wilmington, Del. followed by B-staging to dryness at about 70° C. for about 60 minutes to obtain a dry thickness of about 50 microns. The insulating matrix 112 of flexible insulating adhesive type LESP7450-SC is then roll coated directly over the patterns of flexible conductive adhesive features 114, the thickness of which define the thickness of the insulating matrix 112. Because different solvents are utilized in the insulating and conductive adhesive materials, there is no smear observable in the flexible conductive adhesive features 114 as a result of this roll coating process. The wet insulating adhesive matrix 112 is also B-staged at about 70° C. for about 60 minutes to obtain a dry thickness of about 40 microns. As mentioned above, it is of no consequence if some of the insulating adhesive material, which has a higher flow characteristic, remains on the conductive adhesive features 114, which have a lesser flow characteristic, because the conductive adhesive features 114 will predominate and penetrate such remaining insulating adhesive material under the pressure and temperature applied in attaching the flexible membrane 110 to a substrate, for example attachment bonding performed at about 195° C. for about 30 seconds with about 5 psi pressure. Also as previously described, this flexible membrane 110 of insulating and conductive adhesives is laminated over a panel including a plurality of repetitively patterned substrates employed for the next level board substrates, such a ceramic circuit substrates or FR4 printed wiring circuit boards, using the relational alignment holes therein for alignment of the stencils and the panel. The panel of plural next level board substrates is then excised or separated into individual substrates 302 that are ready for the bonding of electronic components thereto, such as the flip chips 320a, 320b in FIG. 10. It is noted that the relational alignment holes 116 in the flexible membrane may include relational alignment holes for aligning the flexible membrane 110 onto the panel as well as further sets of relational alignment holes for each individual substrate or circuit board of the panel.

EXAMPLE 13

Example 13 is a flexible membrane 110 as in Example 12, but employing a different sequence of fabrication to produce the substantially the same extra-fine featured membrane 110 having 75 micron diameter conductive features 114 at a 150 micron pitch. Flexible conductive adhesive features 114 formed of flexible conductive adhesive type LTP8150 are deposited with wet thickness of about 75 microns onto a suitable release substrate 111, such as a sheet of Teflon® material, and are then B-staged to dryness at about 70° C. for about 60 minutes resulting in features about 50 microns thick. Flexible insulating adhesive type LESP7450-SC is separately roll coated at a wet thickness of about 75 microns onto a release substrate and is B-staged at about 60° C. for about 60 minutes to form a uniform film having a dry thickness of about 50 microns. Types LESP7450-SC and ESP7450-SC flexible insulating adhesives and films formed thereof are also available from AI Technology. The ESP7450-SC film having a thickness that is substantially the same as that of the flexible conductive features 114 is removed from the release substrate on which it was formed and is placed over the pattern of flexible conductive features 114 on the release liner 111 and is laminated thereto at a temperature of about 80° C. under a pressure of about 10 psi. This over-lamination process can form flexible insulating matrix 112 within seconds without affecting the positions or shapes of flexible conductive features 114 because the type TP8150 conductive adhesive has a melt flow temperature Tm of about 200° C. as compared to the Tm of about 80° C. of the type ESP7450 insulating adhesive. Thus, the dry conductive features 114 of TP8150 adhesive will not flow under this low laminating temperature of about 80° C. and will penetrate and be fused into the ESP7450 film forming insulating matrix 112. Upon cooling to ambient temperature, a dry flexible membrane 110 having a dry thickness of about 50 microns is formed. This flexible membrane 110 of flexible conductive adhesive features 114 and flexible insulating adhesive matrix 112 is aligned with and laminated onto a semiconductor wafer or other substrate utilizing the relational alignment holes 116 formed into membrane 110 and the corresponding relational alignment holes in the wafer or other substrate. The semiconductor wafers are then diced into individual dies that are ready for bonding to another substrate, such as are flip chips 320a and 320b attached to substrate 302 in FIG. 10, at a bonding temperature of about 195° C. for about 30 seconds under about 5 psi pressure.

EXAMPLE 14

Example 14 is the use of a flexible membrane similar to that of Example 9 wherein the next level substrate is made of FR4 material and has multiple sites or repetitions of substrate patterns as is the case, for example, for multiple-chip modules of the sort employed in higher performance personal computers. The microprocessor and cache memory semiconductor wafers are laminated with a flexible membrane 110 and are diced into individual dies 320a, 320b, each having a respective flexible membrane 310a, 310b attached thereto, before mounting onto the multi-chip module board 302. In this example, flexible insulating adhesive type ESP7455 (which employs the same polymer resin as type ESP7450 thermosetting adhesive, but is filled with alumina particles to enhance thermal conductivity) is modified by filling with particles of an insulating ferrite material, such as $Fe_3O_4$, that has high magnetic permeability, and flexible conductive adhesive type TP8159 (which employs the same thermoplastic polymer resin as type TP8150 but is filled with gold-plated nickel flakes that are both electrically conductive and have high magnetic permeability) are employed in the flexible membrane 310a for microprocessor 320a because of its higher thermal dissipation. Insulating adhesive type ESP7450 and conductive adhesive type TP8159 are employed in the flexible membrane 310b for the lower power cache memory devices. In this example, both the insulating and conductive adhesives have a melt flow temperature Tm that is greater than about 85° C., the temperature at which the semiconductor wafer and/or semiconductor die are stressed during probing and electrical testing. At least one of the insulating and conductive adhesives has a filler material having high magnetic permeability so that an electromagnetic chuck can be energized to create a magnetic field that holds the flexible membrane 110 against the wafer after proper alignment for probing and testing of the individual circuits formed on the wafer. Alignment of the flexible membrane may utilize either optical or mechanical alignment means.

EXAMPLE 15

Example 15 is the use of a flexible membrane similar to that of Example 14 wherein the next level substrate is made of FR4 material and has multiple sites or repetitions of substrate patterns as is the case, for example, for multiple-chip modules of the sort employed in higher performance personal computers. The microprocessor and cache memory semiconductor wafers are laminated with a flexible membrane 110 and are diced into individual dies 320a, 320b, each having a respective flexible membrane 310a, 310b attached thereto, before mounting onto the multi-chip module board 302. In this example, flexible insulating adhesive type TP7157 (which is the same polymer resin as is type TP7150 thermoplastic adhesive, but is filled with silicon carbide particles to enhance thermal conductivity) is modified by addition of particles of an insulating ferrite material, such as $Fe_3O_4$, that has high magnetic permeability, and flexible conductive adhesive type TP8159 (filled with gold-plated nickel flakes having high magnetic permeability) are employed in the flexible membrane 310a for microprocessor 320a because of its higher thermal dissipation. Insulating adhesive type TP7157 and conductive adhesive type TP8159 are employed in the flexible membrane 310b for the lower power cache memory devices. In this example, both the insulating and conductive adhesives have a melt flow temperature Tm that is greater than about 85° C., the temperature at which the semiconductor wafer and/or semiconductor die are stressed during probing and electrical testing. In addition, the filler materials employed in both the insulating and conductive adhesives have high magnetic permeability so that an electromagnetic chuck can be energized to create a magnetic field that holds the flexible membrane 110 against the wafer after proper alignment for probing and testing of the individual circuits formed on the wafer. Alignment of the flexible membrane may utilize either optical or mechanical alignment means. After wafer-level testing is completed, the electromagnet can be turned off for easy separation of the flexible membrane from the wafer. Alternatively, the flexible membrane may be attached to the semiconductor wafer at a temperature of about 100 and a pressure of about 10 psi for about one minute before the wafer is diced. Then, individual microprocessor 320a and/or cache memory chip 320b may be held against substrate 302 containing electronic circuitry and the magnetic chuck again energized to hold microprocessor 320a and/or cache memory chip 320b in place for testing of the electronic circuitry of circuit board 302 before final bonding of such electronic components thereto.

It is noted that because flexible conductive features 114 are preferably of substantially the same height as is the flexible insulating adhesive matrix 112, and especially for membranes 110 having finer pitch and feature size, the insulating adhesive typically covers the conductive features 114 on at least one side of the flexible membrane 110. The differential flow characteristics of the conductive and insulating adhesives according to one aspect of the present invention cause the conductive features 114 to penetrate the insulating adhesive matrix 112 during the bonding operation to complete electrical connections between the respective contacts on the electronic component and the substrate.

Flexible membranes have been fabricated according to Examples 1, 2, 3, 9, 10 and 12 above and have demonstrated high-reliability interconnections when tested under conditions of thermal cycling between −55 and +150° C. for over 1000 cycles and under conditions of moisture-temperature-biased testing at 85% relative humidity and 85° C. for more than 168 hours. Interconnections formed by the flexible conductive adhesives exhibited volume resistivity of about 0.01 ohm-cm and the insulating adhesive matrices exhibited volume resistivity in excess of $10^{12}$ ohm-cm. This performance is an improvement over prior art interconnections employing solder and rigid underfill matrices or employing rigid conductive epoxy adhesive interconnections. Certain characteristics of the adhesives utilized in the foregoing examples are summarized in the Table of FIG. 11.

It is noted that for extra-fine pitch and conductive features such as features of about 25 to 500 microns, the cost of masks and stencils is quite substantial, perhaps $500 to $5000 depending upon whether they are fabricated by a photo-etching method or a plating-up process. Current photo-etching methods can form features of about 75 microns dimension and about 150 microns pitch. For these extra-fine features, however, sets of relational alignment holes are preferably incorporated into the stencils and masks employed to form conductive features and the insulating matrix, into the release substrate, as well as into the flexible membrane that is to be aligned with a semiconductor wafer or other substrate.

While the present invention has been described in terms of the foregoing exemplary embodiments, variations within the scope and spirit of the present invention as defined by the claims following will be apparent to those skilled in the art. For example, the terms electrical component and electronic component are used interchangeably and encompass all kinds of components, including but not limited to semiconductor die, integrated circuits, transistors, diodes, chip resistors, chip capacitors, chip inductors or other electronic devices or components, or electronic boards or substrates, panels of such boards or substrates, or combinations thereof. In addition, at least two different sets of guide holes may be constructed and used where many substrates or electronic components are formed on a single substrate, such as a semiconductor wafer or a panel of individual electronic substrates. One set of relational alignment holes is to align the stencils or masks in relation to the release liner and the flexible membrane and in relation to the panel of substrates, and the other set or sets of relational alignment holes are in known predetermined relation to the first set of relational alignment holes, but are interior to the flexible membrane so as to correspond to corresponding sets of guide holes on the individual substrates to permit alignment of individual flexible membranes thereto.

What is claimed is:

1. A flexible adhesive membrane comprising:
    a pattern of a plurality of electrically conductive features formed of a flexible electrically conductive adhesive having a predetermined flowability and adapted for adhesively attaching to electrical contacts; and
    an electrically insulating matrix surrounding and adhering to said plurality of electrically conductive features, said electrically insulating matrix being a membrane formed of a flexible electrically insulating adhesive having a greater flowability than that of said flexible electrically conductive adhesive.

2. The flexible adhesive membrane of claim 1 wherein said flexible electrically conductive adhesive has a first melt flow temperature and said flexible electrically insulating adhesive has a second melt flow temperature that is lower than the first melt flow temperature.

3. The flexible adhesive membrane of claim 1 wherein said flexible electrically conductive adhesive and said flexible electrically insulating adhesive each have a respective melt flow temperature, and wherein at a given temperature higher than said respective melt flow temperatures, said flexible electrically conductive adhesive has a higher viscosity than does said flexible electrically insulating adhesive.

4. The flexible adhesive membrane of claim 1 wherein said flexible electrically conductive adhesive and said flexible electrically insulating adhesive each have a respective melt flow temperature that is greater than about 80° C.

5. The flexible adhesive membrane of claim 1 wherein said flexible electrically conductive adhesive and said flexible electrically insulating adhesive are both selected from the group consisting of thermoplastic adhesives and thermosetting adhesives.

6. The flexible adhesive membrane of claim 1 wherein said flexible electrically conductive adhesive includes a thermoplastic adhesive and said flexible electrically insulating adhesive includes a thermosetting adhesive.

7. The flexible adhesive membrane of claim 1 wherein said electrically conductive features and said flexible insulating matrix have substantially the same thickness.

8. The flexible adhesive membrane of claim 1 wherein said flexible electrically conductive adhesive and said flexible electrically insulating adhesive each have a respective modulus of elasticity of less than about 100,000 psi.

9. The flexible adhesive membrane of claim 1 wherein said flexible electrically conductive adhesive and said flexible electrically insulating adhesive each have a respective glass transition temperature that is less than about 25° C.

10. The flexible adhesive membrane of claim 1 in combination with an electrical component having a pattern of contacts thereon corresponding to the pattern of said plurality of electrically conductive features wherein respective ones of said plurality of electrically conductive features contact corresponding ones of said contacts.

11. The flexible adhesive membrane of claim 10 wherein said electrical component is selected from the group consisting of a semiconductor wafer, a semiconductor die, a semiconductor device, a panel of substrates, a substrate, a panel of printed wiring circuit boards, a printed wiring circuit board, a chip capacitor, a chip resistor, a chip inductor, and combinations thereof.

12. The flexible adhesive membrane of claim 10 wherein said electrically insulating matrix includes a plurality of relational alignment holes located in known predetermined spatial relationship to said pattern of a plurality of electrically conductive features, and wherein said electrical component includes a plurality of relational alignment holes located in said same known predetermined spatial relationship to said pattern of contacts thereon.

13. The combination of said flexible adhesive membrane and said electrical component of claim 10 further comprising a substrate proximate said flexible adhesive membrane, wherein said electrical component is attached to said substrate by adhesion of at least one of the flexible electrically conductive adhesive of said electrically conductive features of said flexible adhesive membrane and the flexible electrically insulating adhesive of said electrically insulating matrix of said flexible adhesive membrane.

14. The flexible adhesive membrane of claim 1 wherein said flexible electrically conductive adhesive includes electrically conductive particles having a high magnetic permeability.

15. The flexible adhesive membrane of claim 1 wherein said flexible electrically insulating adhesive includes electrically insulating particles having a high magnetic permeability.

16. A flexible adhesive membrane comprising:
    a pattern of a plurality of electrically conductive features formed of a flexible electrically conductive adhesive having a predetermined flowability and adapted for adhesively attaching to electrical contacts; and an electrically insulating matrix surrounding and adhering to said plurality of electrically conductive features, said electrically insulating matrix being a membrane formed of a flexible electrically insulating adhesive having a greater flowability than that of said flexible electrically conductive adhesive, wherein at least ones of said plurality of electrically conductive features include an enlarged area proximate one surface of said electrically insulating matrix, which enlarged area overlies and adheres to the one surface of said electrically insulating matrix.

17. A flexible adhesive membrane comprising:

a pattern of a plurality of electrically conductive features formed of a flexible electrically conductive adhesive having a predetermined flowability and adapted for adhesively attaching to electrical contacts; and an electrically insulating matrix surrounding and adhering to said plurality of electrically conductive features, said electrically insulating matrix being a membrane formed of a flexible electrically insulating adhesive having a greater flowability than that of said flexible electrically conductive adhesive, wherein said electrically conductive features and said electrically insulating matrix are formed of a plurality of layers, and wherein said pattern of a plurality of electrically conductive features has a given size and pitch in a first of said plurality of layers proximate one surface of said electrically insulating matrix and has a size and pitch larger than said given size and pitch in a layer proximate an opposite surface thereof.

18. A flexible adhesive membrane comprising:

a pattern of a plurality of electrically conductive features formed of a flexible electrically conductive adhesive having a predetermined flowability and adapted for adhesively attaching to electrical contacts; and an electrically insulating matrix surrounding and adhering to said plurality of electrically conductive features, said electrically insulating matrix being a membrane formed of a flexible electrically insulating adhesive having a greater flowability than that of said flexible electrically conductive adhesive, wherein part of said flexible electrically insulating adhesive covers at least some of said plurality of electrically conductive features at one surface of said flexible adhesive membrane.

19. An electronic device comprising:

an electronic component having a pattern of electrical contacts on one surface thereof;

a substrate having a pattern of electrical contacts on one surface thereof corresponding to the pattern of electrical contacts on said electronic component;

wherein said electronic component is disposed with the one surface thereof opposite the one surface of said substrate; and a flexible adhesive membrane attaching said electronic component to said substrate comprising:

a plurality of electrically conductive features in a pattern corresponding to the pattern of electrical contacts, said plurality of electrically conductive features adhesively attaching to and forming respective electrical connections between corresponding ones of the electrical contacts on said electronic component and the electrical contacts on said substrate, said plurality of electrically conductive features being formed of a flexible electrically conductive adhesive having a predetermined flowability; and an electrically insulating matrix surrounding and adhering to said plurality of electrically conductive features, said electrically insulating matrix being a membrane formed of a flexible electrically insulating adhesive having a greater flowability than that of said flexible electrically conductive adhesive.

20. The electronic device of claim 19 wherein said flexible electrically conductive adhesive and said flexible electrically insulating adhesive each have a respective modulus of elasticity of less than about 100,000 psi.

21. The electronic device of claim 19 wherein said flexible electrically conductive adhesive and said flexible electrically insulating adhesive each have a respective glass transition temperature that is less than about 25° C.

22. The electronic device of claim 19 wherein at least ones of said plurality of electrically conductive features include an enlarged area proximate one of said electronic component and said substrate, which enlarged area overlies and adheres to said electrically insulating matrix and to one of the electrical contacts on the one of said electronic component and said substrate.

23. The electronic device of claim 19 wherein said electrically conductive features and said electrically insulating matrix are formed of a plurality of layers, and wherein the pattern of said plurality of electrically conductive features has a given size and pitch in a first of said plurality of layers adjacent said electronic component and has a size and pitch larger than said given size and pitch in a layer adjacent said substrate.

24. The electronic device of claim 19 wherein said electronic component is selected from the group consisting of a semiconductor wafer, a semiconductor die, a semiconductor device, a panel of substrates, a substrate, a panel of printed wiring circuit boards, a printed wiring circuit board, a chip capacitor, a chip resistor, a chip inductor, and combinations thereof.

25. The electronic device of claim 19 wherein said electrically insulating matrix includes a plurality of relational alignment holes located in known predetermined spatial relationship to the pattern of said plurality of electrically conductive features, and wherein at least one of said electronic component and said substrate includes a plurality of relational alignment holes located in said same known predetermined spatial relationship to the pattern of electrical contacts thereon.

* * * * *